United States Patent
Bornfreund

(10) Patent No.: US 8,471,204 B2
(45) Date of Patent: Jun. 25, 2013

(54) MONOLITHIC ELECTRO-OPTICAL POLYMER INFRARED FOCAL PLANE ARRAY

(75) Inventor: Richard E. Bornfreund, Santa Barbara, CA (US)

(73) Assignee: Flir Systems, Inc., Wilsonville, OR (US)

( * ) Notice: Subject to any disclaimer, the term of this patent is extended or adjusted under 35 U.S.C. 154(b) by 342 days.

(21) Appl. No.: 12/977,280

(22) Filed: Dec. 23, 2010

(65) Prior Publication Data

US 2012/0161001 A1  Jun. 28, 2012

(51) Int. Cl.
*H01L 31/00* (2006.01)

(52) U.S. Cl.
USPC ........................... 250/330; 250/339.05

(58) Field of Classification Search
USPC ............................. 250/330, 339.05
See application file for complete search history.

(56) References Cited

U.S. PATENT DOCUMENTS

| | | | |
|---|---|---|---|
| 5,113,076 A * | 5/1992 | Schulte | 250/370.06 |
| 5,265,185 A * | 11/1993 | Ashley | 385/132 |
| 5,808,350 A * | 9/1998 | Jack et al. | 257/440 |
| 5,811,815 A * | 9/1998 | Marshall et al. | 250/370.06 |
| 6,320,189 B1 | 11/2001 | Ouvrier-Buffet et al. | |
| 6,770,068 B2 * | 8/2004 | Ruiz et al. | 606/5 |
| 6,852,976 B2 | 2/2005 | Barton et al. | |
| 7,034,301 B2 | 4/2006 | Parrish et al. | |
| 7,075,079 B2 * | 7/2006 | Wood | 250/332 |
| 7,491,938 B2 * | 2/2009 | Geneczko et al. | 250/339.02 |
| 7,592,593 B2 * | 9/2009 | Kauffman et al. | 250/332 |
| 7,629,582 B2 * | 12/2009 | Hoffman et al. | 250/339.01 |
| 2006/0043297 A1 * | 3/2006 | Ouvrier-Buffet et al. | 250/339.05 |
| 2009/0225165 A1 * | 9/2009 | Reneker et al. | 348/144 |
| 2011/0147877 A1 * | 6/2011 | Wehner et al. | 257/446 |
| 2011/0221025 A1 * | 9/2011 | Bornfreund et al. | 257/437 |

FOREIGN PATENT DOCUMENTS

| | | |
|---|---|---|
| EP | 0 977 275 A1 | 2/2000 |
| JP | 2002111961 | 4/2002 |
| WO | WO 99/39372 A2 | 8/1999 |
| WO | WO 2004/006350 | 1/2004 |
| WO | WO 2008/127297 A2 | 10/2008 |

OTHER PUBLICATIONS

Yu et al., High performance polymer photovoltaic cells and photodetectors, SPIE2000, Conference 4108, paper No. 4108-10, San Diego, CA, Aug. 3, 2000, pp. 1-9.

Yu et al., Polymer Photovoltaic Cells: Enhanced Efficiencies via a Network of Internal Donor-Acceptor Heterojunctions, Science, New Series, vol. 270, No. 5243, Dec. 15, 1995, pp. 1789-1791.

Gong et al., High-Detectivity Polymer Photodetectors with Spectral Response from 300 nm to 1450 nm, Science 325, 1665 (Sep. 25, 2009); pp. 1665-1667.

(Continued)

*Primary Examiner* — Christine Sung
(74) *Attorney, Agent, or Firm* — Haynes and Boone, LLP

(57) ABSTRACT

In one embodiment, a dual-band focal plane array includes a readout circuit (ROIC), and a plurality of electro-optical (EO) polymer pixels for absorbing visible and/or short wave infrared (SWIR) radiation, each of the EO polymer pixels electrically coupled to the ROIC. The detector further includes a plurality of microbolometers for detecting long wave infrared (LWIR) radiation, each microbolometer electrically coupled to the ROIC via contact legs disposed between adjacent microbolometers and between adjacent EO polymer pixels. A method of fabricating a focal plane array is also provided.

15 Claims, 6 Drawing Sheets

OTHER PUBLICATIONS

Kuze et al., High Performance Miniaturized InSb Photovoltaic Infrared Sensors Operating at Room Temperature, Science Direct, Journal of Crystal Growth 301-302 (2007), pp. 997-1000.

Kang et al., Partitioning of the Organic Layers for the Fabrication of High Efficiency Organic Photovoltaic Devices, Organic Electronics 10 (2009), pp. 1091-1096.

* cited by examiner

MONOLITHIC ELECTRO-OPTICAL POLYMER INFRARED FOCAL PLANE ARRAY

TECHNICAL FIELD

One or more embodiments of the invention relate generally to infrared imaging devices and, more particularly, to an improved infrared detector.

BACKGROUND

Imaging devices that detect various regions of the electromagnetic spectrum are used in a variety of commercial and military applications. One type of imaging device uses a focal plane array (FPA) to detect infrared radiation. An FPA, for example, may be formed from an array of infrared detectors, with each infrared detector functioning as a pixel to produce a two-dimensional image. The change in signal level output of each infrared detector due to received incident infrared radiation is translated into a time-multiplexed electrical signal by circuitry known as the readout integrated circuit (ROIC). The combination of the ROIC and the infrared detector array is commonly known as a FPA or infrared FPA. FPAs (e.g., microbolometer FPAs) are described in further detail in U.S. Pat. Nos. 5,756,999, 6,028,309, and 6,852,976, which are herein incorporated by reference in their entirety.

Conventional hybrid detectors, such as night vision imagers for sensing both short wave infrared (SWIR) radiation and long wave infrared (LWIR) radiation, have used a hybrid approach requiring the use of indium bump interconnects to interconnect individual detector pixels to the ROIC. Such an approach has caused increased costs of manufacture and additional processing steps.

As a result, there is a need for an improved infrared focal plane array and methods of manufacture of such improved infrared focal plane arrays.

SUMMARY

In accordance with one embodiment, a focal plane array includes a readout circuit (ROIC), a plurality of electro-optical (EO) polymer pixels electrically coupled to the ROIC, an overglass layer disposed between adjacent EO polymer pixels for electrically isolating each EO polymer pixel, and an electrical contact layer disposed over the overglass layer and the plurality of EO polymer pixels for coupling the plurality of EO polymer pixels to a ground line.

In accordance with another embodiment, a dual-band focal plane array includes a readout circuit (ROIC), and a plurality of electro-optical (EO) polymer pixels for absorbing visible and/or short wave infrared (SWIR) radiation, each of the EO polymer pixels electrically coupled to the ROIC. The detector further includes a plurality of microbolometers for detecting long wave infrared (LWIR) radiation, each microbolometer electrically coupled to the ROIC via contact legs disposed between adjacent microbolometers and between adjacent EO polymer pixels.

In accordance with yet another embodiment, a method of fabricating a focal plane array includes providing a readout circuit (ROIC), and electrically coupling a plurality of electro-optical (EO) polymer pixels to the ROIC, the EO polymer pixels for absorbing light of a first wavelength. The method further includes electrically coupling a plurality of microbolometers to the ROIC, with each microbolomer electrically coupled via contact legs disposed between adjacent microbolometers and between adjacent EO polymer pixels, and each microbolometer for detecting light of a second wavelength.

The scope of the invention is defined by the claims, which are incorporated into this Summary by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the invention and their advantages are best understood by referring to the detailed description that follows. It should be appreciated that like reference numerals are used to identify like elements illustrated in one or more of the figures.

DETAILED DESCRIPTION

Figure 1A:
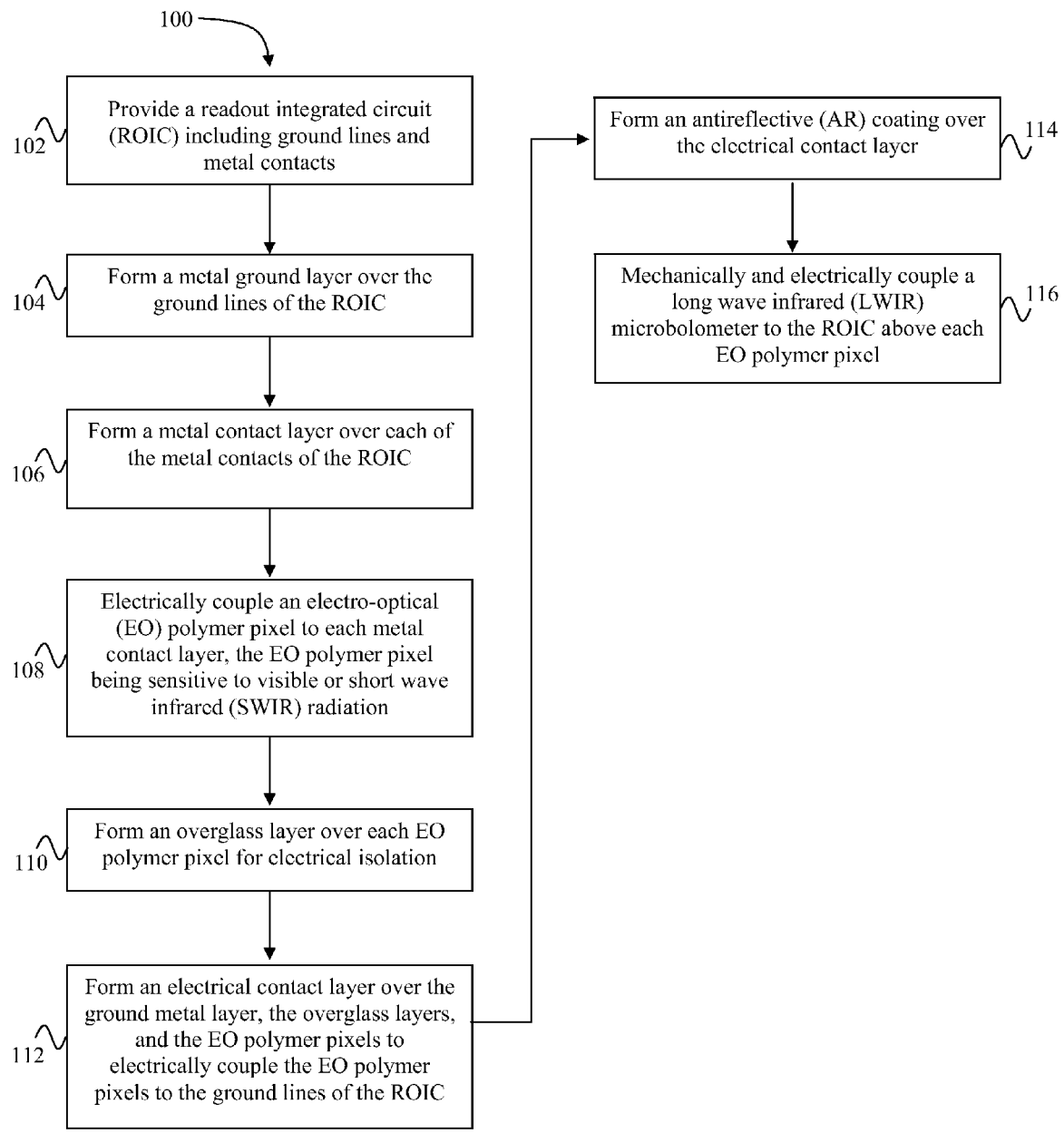
FIG. 1A shows a flow diagram illustrating a method of fabricating a monolithic electro-optical polymer infrared focal plane array (FPA) in accordance with an embodiment.

Systems and methods are disclosed herein to provide an infrared focal plane array with improved electro-optical performance and manufacturing costs in accordance with one or more embodiments. For example, in accordance with an embodiment, FIG. 1A shows a flow diagram illustrating a method 100 of fabricating an improved focal plane array (FPA).

At block 102, a readout integrated circuit (ROIC) including ground lines and metal contacts is provided. At block 104, a metal ground layer is formed over the ground lines of the ROIC, and at block 106, a metal contact layer is formed over each of the metal contacts of the ROIC.

At block 108, an electro-optical (EO) polymer layer is deposited over and electrically coupled to each metal contact layer. The EO polymer layer is then etched to form an EO polymer pixel over each metal contact layer. In one example, the EO polymer layer may be etched by standard photolithography patterning and etch techniques, using for example dry and/or wet etch techniques. In one embodiment, each EO polymer pixel is directly coupled to a metal contact layer and thus to the metal contact of the ROIC, thereby electrically coupling each EO polymer pixel to the ROIC. Each EO polymer pixel absorbs visible and/or short wave infrared (SWIR) radiation in one embodiment.

At block 110, an overglass layer is formed over each EO polymer pixel for electrically isolating each EO polymer pixel. In one embodiment, an overglass layer is formed between and shared by adjacent EO polymer pixels.

At block 112, an electrical contact layer is formed over the ground metal layer, the overglass layers, and the EO polymer pixels to electrically couple the EO polymer pixels to the ground lines of the ROIC.

At block 114, an optional antireflective (AR) coating designed to optimize the waveband of interest may be formed over the electrical contact layer to decrease the reflectance and/or increase the light received by the EO polymer pixels. In one embodiment, the antireflective coating may be a single layer or a multilayer coating. In a second embodiment, the AR coating serves to both increase the light received by the EO polymer pixel and to reflect long wave infrared (LWIR) light reflecting the band of interest to improve the microbolometer response.

At block 116, in one embodiment, a LWIR microbolometer is mechanically and electrically coupled to the ROIC above each EO polymer pixel. The LWIR microbolometer is sufficiently transparent in a first band (e.g., the visible and/or SWIR bands) to allow the radiation in the first band to pass through the microbolometer and be absorbed by the EO polymer pixel, which can absorb the radiation in the first band. The microbolometer above each EO polymer pixel can absorb radiation in a second band, such as the LWIR band.

In accordance with one embodiment, the LWIR microbolometer is electrically coupled to the ROIC by contact legs disposed between adjacent microbolometers and between adjacent EO polymer pixels. In another embodiment, the LWIR microbolometer may be electrically coupled to the ROIC by a shared contact leg disposed between adjacent microbolometers and between adjacent EO polymer pixels. In yet another embodiment, the LWIR microbolometer may be electrically coupled to the electrical contact layer via an isolated leg opposite the shared contact leg with an EO polymer pixel between the isolated leg and the shared contact leg. Thus, the isolated leg of the LWIR microbolometer is coupled to a ground in one example.

Figure 1B:
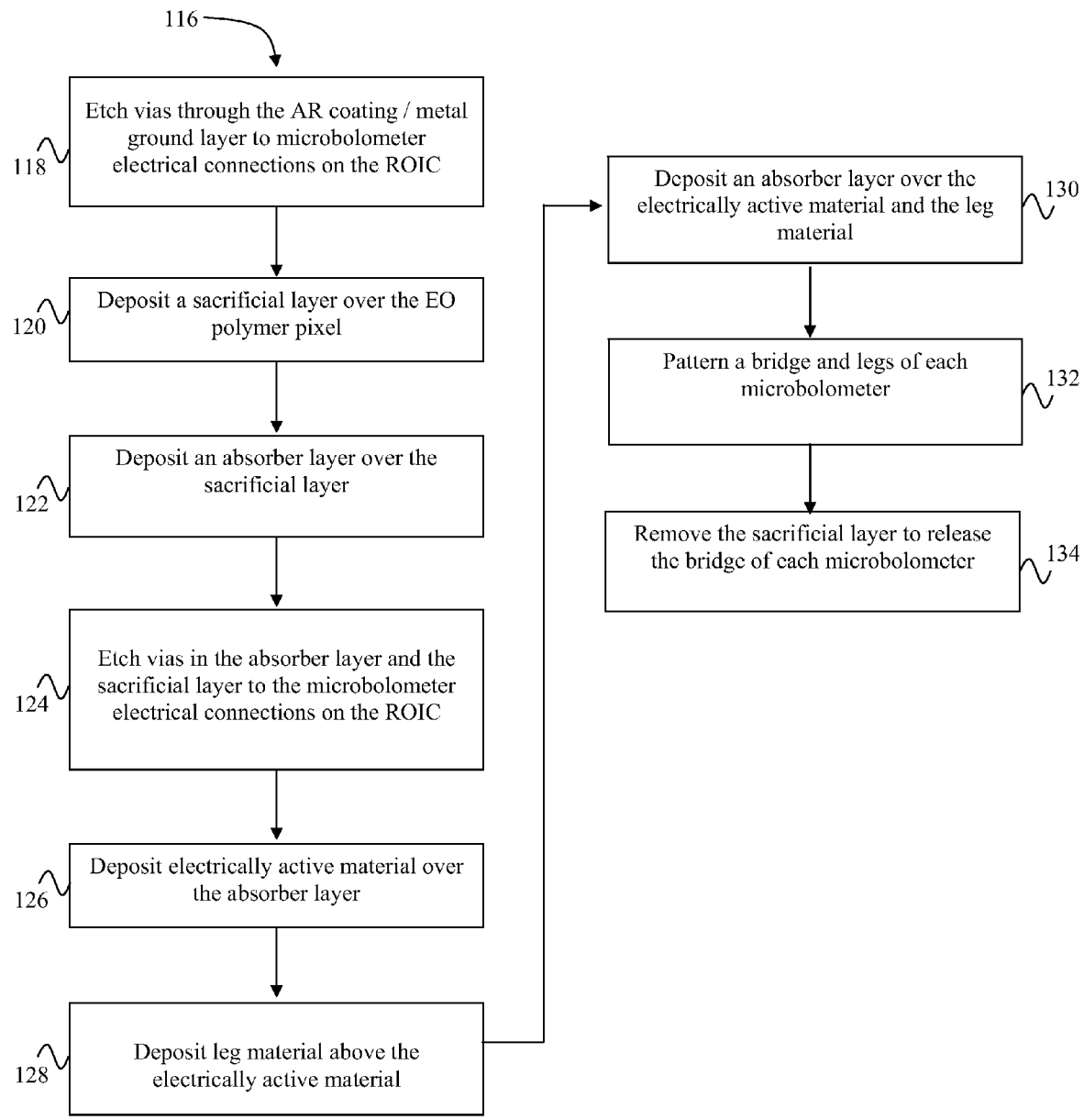
FIG. 1B shows a flow diagram illustrating a method of coupling a microbolometer to an ROIC in accordance with an embodiment.

Referring now to FIG. 1B, a flow diagram is shown illustrating a method 116 of coupling a microbolometer to an ROIC in accordance with an embodiment.

At block 118, in one embodiment, vias are etched in the AR coating, polymer pixel, and backside ground layer down to electrical connections on the ROIC for the microbolometer.

At block 120, in one embodiment, a sacrificial layer is deposited above the EO polymer pixel, the overglass layer, and the electrical contact layer. In one embodiment, the sacrificial layer may be comprised of alpha-silicon, and/or may have a thickness of about 2 microns.

At block 122, in one embodiment, an LWIR absorber layer (e.g., silicon dioxide) is deposited on the sacrificial layer.

At block 124, in one embodiment, vias are etched through the sacrificial layer down to the microbolometer electrical connections on the ROIC.

At block 126, in one embodiment, an electrically active material, such as alpha-silicon or vanadium oxide, is deposited above the absorber layer of block 122.

At block 128, in one embodiment, a leg material (e.g., a metal such as NiCr) is deposited above the electrically active material of block 126.

At block 130, in one embodiment, a capping/LWIR absorption layer (e.g. silicon dioxide) is deposited above the electrically active material and the leg material.

At block 132, in one embodiment, the bridge and leg materials of blocks 126, 128 and 130 are etched (e.g., using an ion mill) to form the bridge structure and support legs.

At block 134, in one embodiment, the bridge and leg structures are "released" by using a selective etch of the sacrificial layer.

It is noted that additional processes may be provided before, during, and/or after methods 100 and 116 of FIGS. 1A and 1B, respectively, as would be understood by one skilled in the art, and that some other processes may only be briefly described herein.

Referring now to FIGS. 2A-2E, cross-sectional diagrams illustrate fabrication processes of a focal plane array 200 in accordance with an embodiment of method 100 shown in FIG. 1A.

Figure 2A:
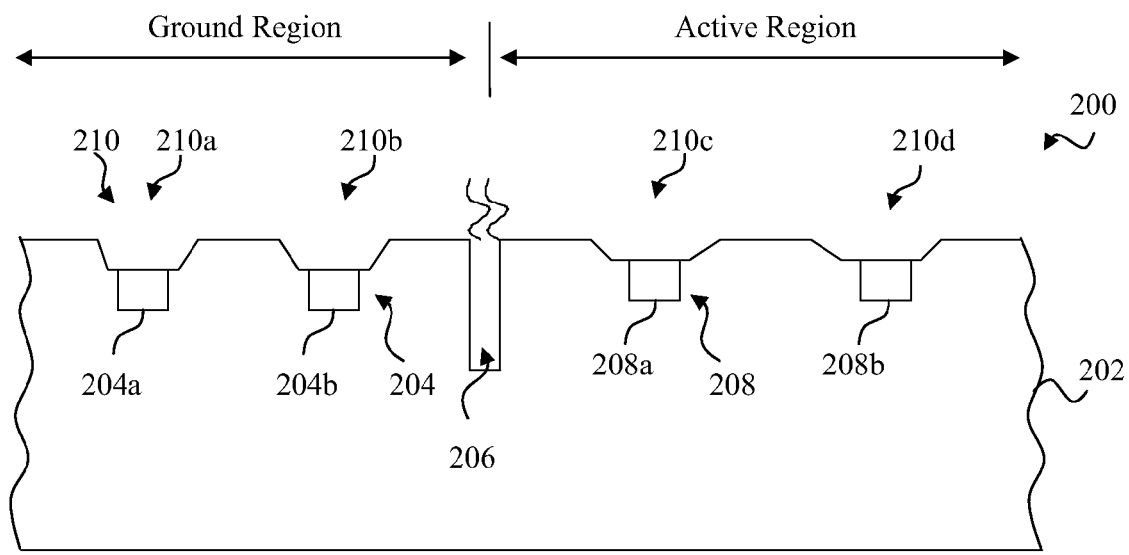
FIGS. 2A-2E show cross-sectional diagrams illustrating fabrication processes of a FPA in accordance with an embodiment of the method shown in FIG. 1.

FIG. 2A shows a detector array 200 including a substrate having a readout integrated circuit (ROIC) 202. In one embodiment, the substrate may be comprised of silicon or may alternatively include silicon germanium, gallium arsenic, or other suitable semiconductor materials. The substrate may further include doped regions, such as a P-well, an N-well, and/or a doped active region such as a P+ doped active region. In one aspect, the doped active regions may be disposed within other regions. The substrate may further include other features such as a buried layer, and/or an epitaxy layer. Furthermore, the substrate may be a semiconductor on insulator such as silicon on insulator (SOI). In other embodiments, the semiconductor substrate may include a doped epitaxy layer, a gradient semiconductor layer, and/or may further include a semiconductor layer overlying another semiconductor layer of a different type such as a silicon layer on a silicon germanium layer. In other examples, a compound semiconductor substrate may include a multilayer silicon structure or a silicon substrate may include a multilayer compound semiconductor structure.

ROIC 202 includes ground lines 204 and metal contacts 208. In this particular embodiment, a pair of ground lines 204a, 204b and a pair of metal contacts 208a, 208b are illustrated but the disclosure is not limited to this number of ground lines and metal contacts and more or less may be included in the ROIC 202. ROIC 202 further includes a ground region and an active region separated by a trench 206 in one example (as illustrated in FIG. 2A). ROIC 202 further includes trenches 210 including trenches 210a, 210b, 210c, and 210d overlying the grounds lines 204a, 204b and metal contacts 208a, 208b, respectively. In one aspect, the ROIC is a commercially available or custom designed ROIC configured to collect charge carriers from a pixilated polymer film and to multiplex the amount of charge by pixel to electronics which can recreate the observed image.

Figure 2B:
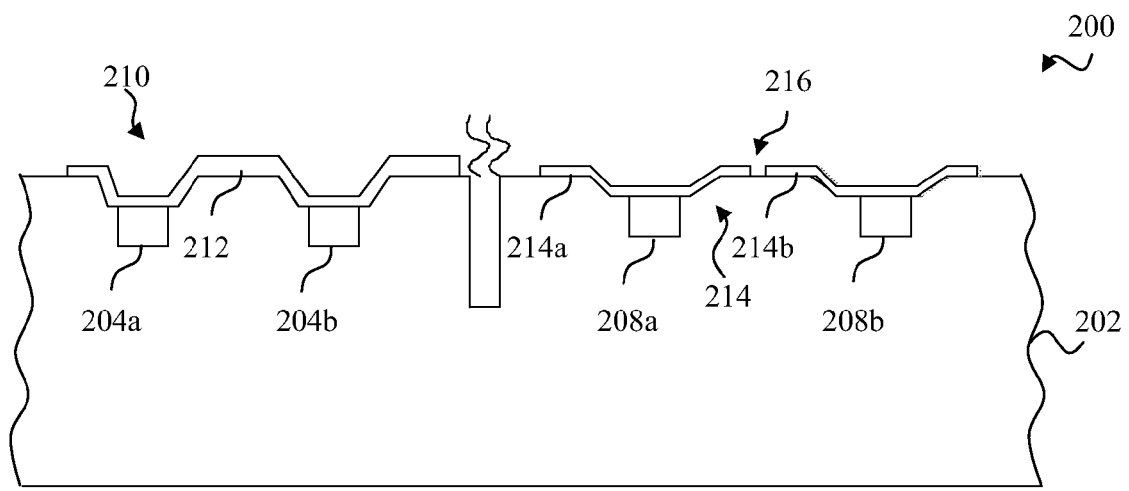

FIG. 2B shows a metal ground layer 212 formed over the ground lines 204a, 204b and a metal contact layer 214 formed over each of the metal contacts 208 of the ROIC 202. In one aspect, metal contact layer 214 may be comprised of aluminum, may be deposited in a liftoff process such as evaporation or sputtering, and/or may be etched by standard photolithography patterning and etch techniques. In this particular illustration, a metal contact layer 214a is formed over metal contact 208a and a metal contact layer 214b is formed over metal contact 208b.

Figure 2C:
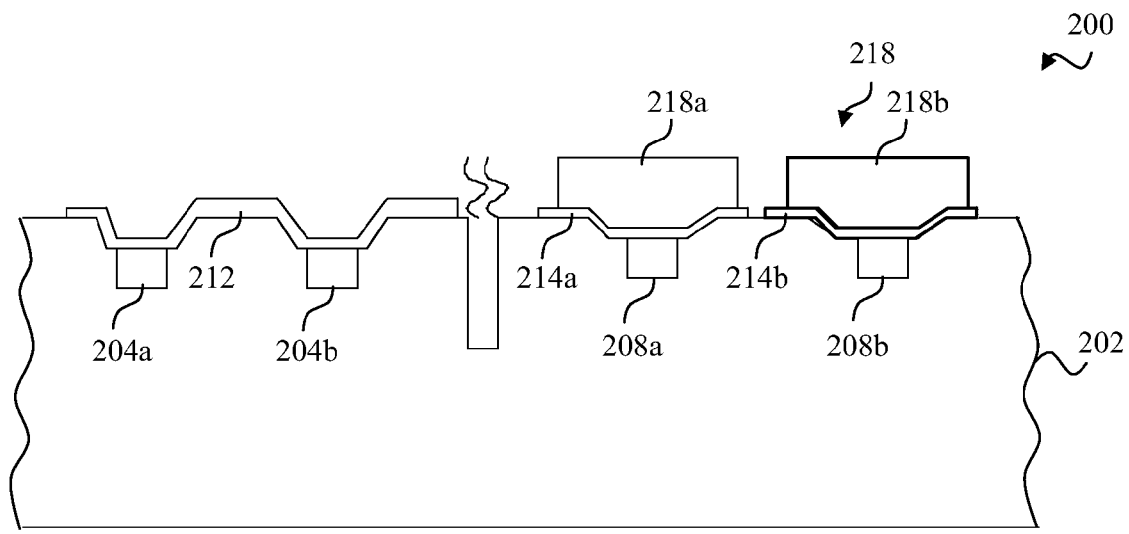

FIG. 2C shows an electro-optical (EO) polymer pixel 218 electrically coupled to each metal contact layer 214, and in one embodiment each EO polymer pixel 218 is directly coupled to a metal contact layer 214, thereby electrically coupling each EO polymer pixel to the metal contacts 208 of the ROIC. In this embodiment, EO polymer pixels 218a, 218b are electrically coupled to metal contact layers 214a, 214b, respectively. Each EO polymer pixel absorbs visible and/or short wave infrared (SWIR) radiation in one embodiment, and according to one aspect, each EO polymer pixel 218 is comprised of an organic polymer including one of polythiophene (PT), polyphenylene vinylene (PPV), [6,6]-phenyl-C61-butryric acid methyl ester (PCBM), derivatives thereof, or combinations thereof.

In one aspect, EO polymer pixel 218 may be deposited onto the ROIC by various methods such as spin-on coating, chemical vapor deposition (CVD), or the like. The EO polymer pixel 218 may be pixelated to isolate the pixels and prevent electrical or optical cross-talk between the pixels. In one aspect, the EO polymer pixel 218 is etched by various methods such as standard photolithography patterning and etch techniques. Advantageously, because the EO polymer pixel 218 is directly coupled to the metal contact layers 214 and the ROIC in a monolithic design, indium bumps, hybrid processing steps, and/or backside thinning processing steps are not required, thus avoiding higher costs and difficult processing steps.

Figure 2D:
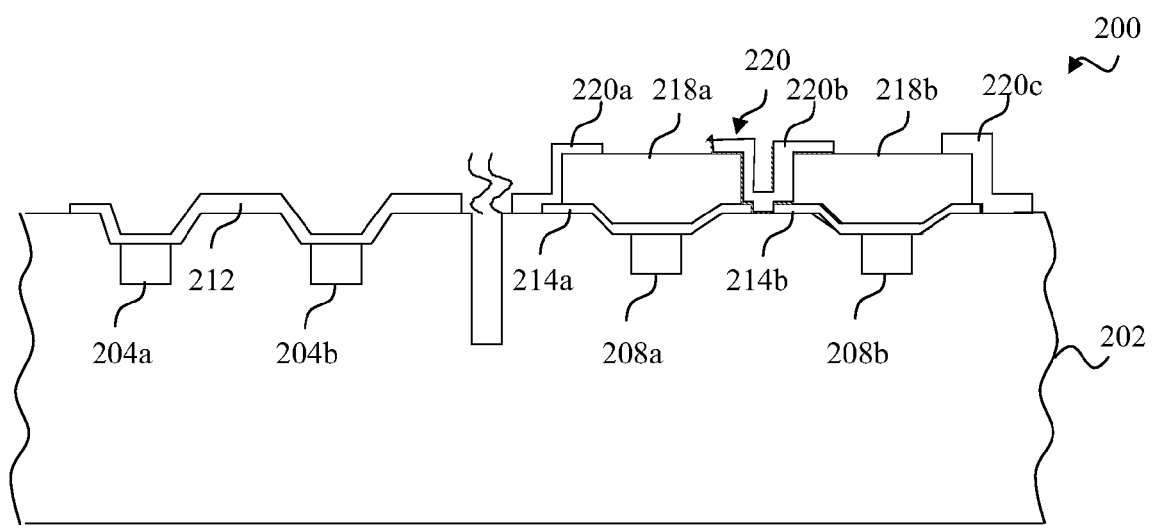

FIG. 2D shows an overglass layer 220 formed over each EO polymer pixel 218 for electrically isolating and protecting the sidewalls of each pixelated EO polymer pixel. In one embodiment, overglass layers 220a and 220b are formed over EO polymer pixel 218a and overglass layers 220b and 220c are formed over EO polymer pixel 218b. In this embodiment, overglass layer 220b is formed between and shared by adjacent EO polymer pixels 218a and 218b. In one aspect, the overglass layers may be comprised of silicon dioxide, silicon nitride, and/or silicon oxynitride, and may be formed as one layer or multiple layers.

Figure 2E:
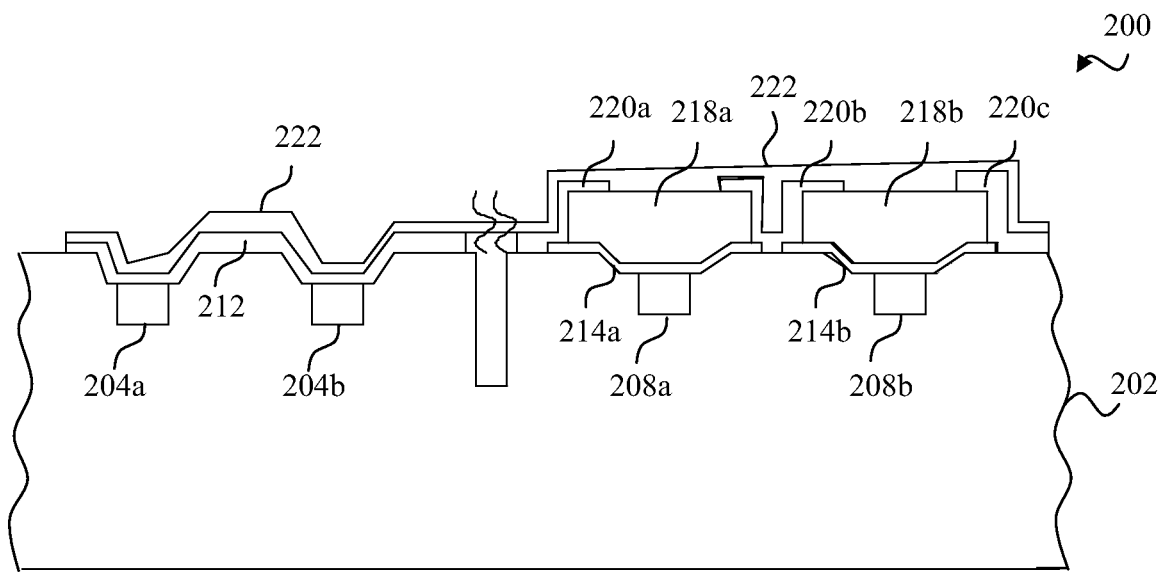

FIG. 2E shows an electrical contact layer 222 formed over the metal ground layer 212, the overglass layers 220, and the EO polymer pixels 218 to electrically couple the EO polymer pixels 218 to the ground lines 204 of the ROIC. Electrical contact layer 222 is optically transparent over a spectral range of interest. In one example, electrical contact layer 222 is optically transparent to visible radiation, SWIR radiation, and/or LWIR radiation. In one aspect, electrical contact layer 222 is comprised of indium tin oxide, which can be deposited by appropriate processes such as evaporation or sputtering.

An optional antireflective (AR) non-conductive coating (not shown) may be formed over the electrical contact layer 222 to decrease the reflectance and/or increase the light received by the EO polymer pixels. The AR coating may also act as a tuned reflector to provide double path absorption for the microbolometer element suspended above the EO polymer pixels. In one embodiment, the AR coating may be a single layer or a multilayer coating.

Figure 3:
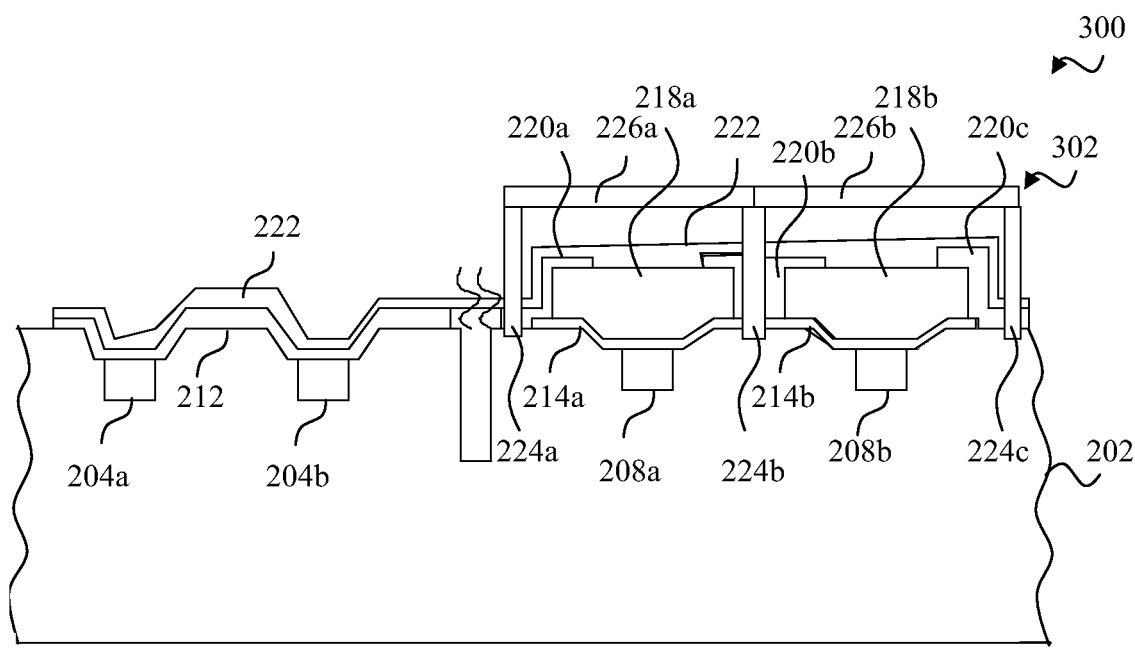
FIG. 3 shows a cross-sectional view of a FPA in accordance with an embodiment.

Referring now to FIG. 3, a cross-sectional view of a focal plane array 300 is illustrated in accordance with an embodiment after the fabrication method 116 of FIG. 1B. Similar elements as those described above with respect to FIGS. 1 and 2A-2E are numbered the same in this embodiment and fully applicable although descriptions are not repeated to avoid repetitiveness.

In this embodiment, an uncooled long wave infrared (LWIR) microbolometer 302 is coupled to the ROIC 202 above each EO polymer pixel 218. According to one aspect, each microbolometer 302 includes a radiation absorbing layer such as a bridge (e.g., bridge 226a or 226b), and in one example the bridge is comprised of at least one of vanadium oxide, amorphous silicon, and amorphous silicon germanium. In one aspect, the radiation absorbing layer is disposed above each EO polymer pixel, and each EO polymer pixel is disposed between the ROIC (e.g., metal contacts 208a, 208b) and each microbolometer radiation absorbing layer (e.g., bridges 226a, 226b). In one example, the radiation absorbing layer is sufficiently transparent in the visible and/or SWIR bands to allow the visible and/or SWIR radiation to pass through the microbolometer and be absorbed by the EO polymer pixel. Thus, in this embodiment the electrical contact layer 222 is optically transparent to visible radiation and/or SWIR radiation. In one embodiment, electrical contact layer 222 is comprised of indium tin oxide, which can be deposited by appropriate processes such as evaporation or sputtering. Accordingly, the FPA 300 may operate in two colors or dual bands.

According to one aspect, the LWIR microbolometer 302 is electrically coupled to the ROIC by legs 224b disposed between adjacent microbolometers (e.g., bridges 226a, 226b) and between adjacent EO polymer pixels 218 (e.g., polymer pixels 218a, 218b). According to another aspect, the LWIR microbolometer 302 is electrically coupled to the electrical contact layer 222 via an isolated leg (e.g., isolated leg 224a or 224c) opposite a shared contact leg with an EO polymer pixel between the isolated leg and the shared contact leg. In one example, isolated leg 224a is opposite the shared contact leg 224b with EO polymer pixel 218a therebetween, and isolated leg 224c is opposite the shared contact leg 224b with EO polymer pixel 218b therebetween.

Advantageously, the present disclosure allows for both simultaneous integration and spatially identical flux capture. As the expanse covered by the visible and/or SWIR detector (EO polymer pixel 218) and the LWIR detector (microbolometer 302) are substantially superimposed over the same area with accurate alignment of the detectors, the captured visible and/or SWIR image information and LWIR image information are substantially co-registered, where the X-Y coordinate of a pixel in a first image can be mapped to the X-Y position of a pixel in a second image without the need for scaling, rotating, and/or shifting either image.

It is often desirable to combine the SWIR image information with the LWIR image information to produce a single image for viewing on a display. Typically, because such image information is captured using more than one detector with each devoted exclusively to capturing one wavelength of light, there is required the combination of more than one source of image information that are not co-registered. As a result, one must typically employ computationally intensive signal processing to shift, scale, and rotate an image from one band, either SWIR or LWIR, until it is aligned, or registered, with the image from the other band. Because the dual band FPA according to embodiments of the present disclosure includes co-registered SWIR detectors and LWIR detectors, the resulting image information provided from the dual band FPA is formed of co-registered image information for each wavelength that does not need additional image shifting to register the bands.

Furthermore, the dual band FPA according to embodiments of the present disclosure allows for a smaller fill factor or physical size of the detector devices as indium bumps and/or other elements are not required with the monolithic design of the present disclosure. Current two-color detectors are based on epitaxially grown films on separate substrates from the ROIC, which then have to be integrated through hybridization/indium interconnects. The epitaxial growth processes and additional interconnects add complexity and cost to the resultant focal plane array, which are avoided in the monolithic design of the present disclosure.

Figure 4:
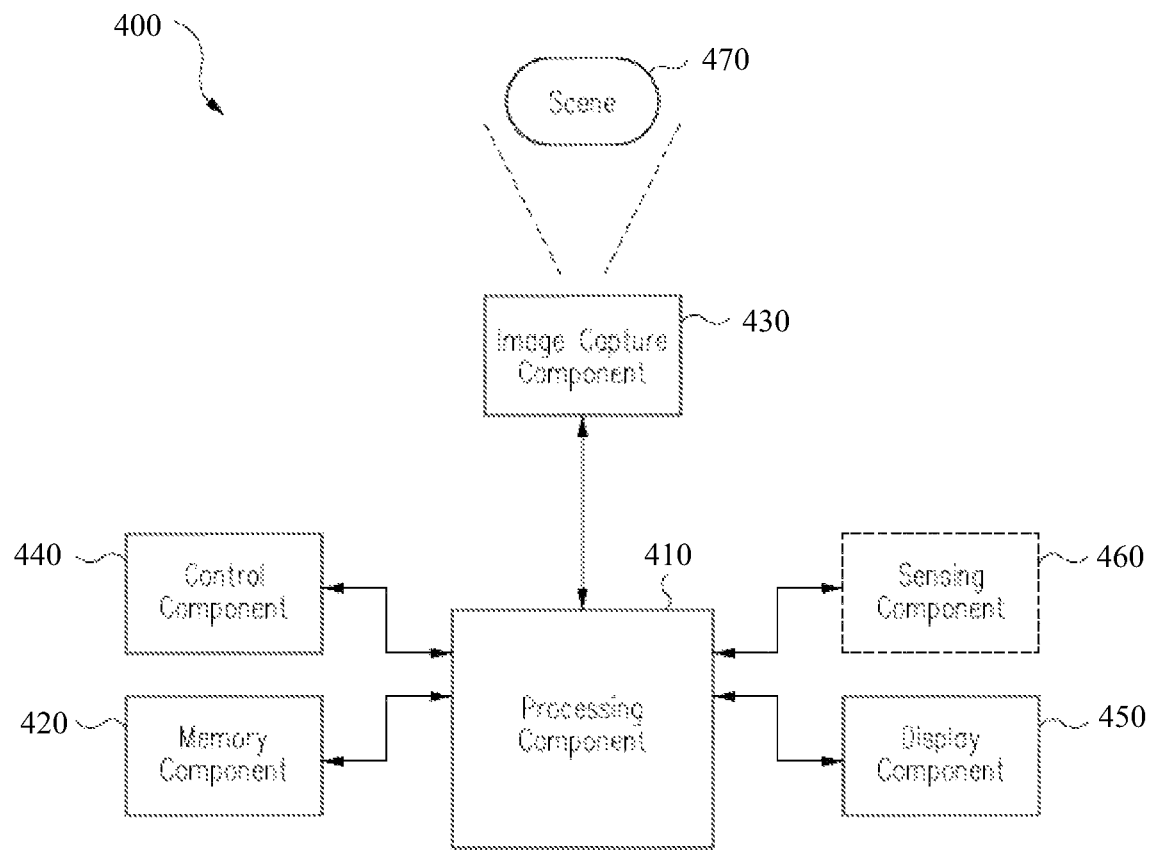
FIG. 4 shows a block diagram illustrating a system for capturing images in accordance with an embodiment.

Referring now to FIG. 4, a block diagram is shown illustrating a system 400 (e.g., an infrared camera) for capturing images and processing in accordance with one or more embodiments. System 400 comprises, in one implementation, a processing component 410, a memory component 420, an image capture component 430, a control component 440, and/or a display component 450. System 400 may further include a sensing component 460.

System 400 may represent for example an infrared imaging device to capture and process images, such as video images of a scene 470. The system 400 may represent any type of infrared camera adapted to detect infrared radiation and provide representative data and information (e.g., infrared image data of a scene) or may represent more generally any type of electro-optical sensor system. In one example, system 400 may represent an infrared camera, a dual band imager such as a night vision imager that operates to sense reflected visible and/or SWIR light for high resolution images and LWIR radiation for thermal imaging, or an imager for sensing both short wave and long wave radiation simultaneously for providing independent image information. System 400 may comprise a portable device and may be incorporated, e.g., into a vehicle (e.g., an automobile or other type of land-based vehicle, an aircraft, a marine craft, or a spacecraft) or a non-mobile installation requiring infrared images to be stored and/or displayed or may comprise a distributed networked system.

In various embodiments, processing component 410 may comprise any type of a processor or a logic device (e.g., a programmable logic device (PLD) configured to perform processing functions). Processing component 410 may be adapted to interface and communicate with components 420, 430, 440, and 450 to perform method and processing steps and/or operations, as described herein such as controlling biasing and other functions (e.g., values for elements such as variable resistors and current sources, switch settings for timing such as for switched capacitor filters, ramp voltage values, etc.) along with conventional system processing functions as would be understood by one skilled in the art.

Memory component 420 comprises, in one embodiment, one or more memory devices adapted to store data and information, including for example infrared data and information. Memory device 420 may comprise one or more various types of memory devices including volatile and non-volatile memory devices. Processing component 410 may be adapted to execute software stored in memory component 420 so as to perform method and process steps and/or operations described herein.

Image capture component 430 comprises, in one embodiment, any type of image sensor, such as for example one or more infrared sensors (e.g., any type of multi-pixel infrared detector, such as the focal plane arrays as described herein) for capturing infrared image data (e.g., still image data and/or video data) representative of an image, such as scene 470. In one implementation, the infrared sensors of image capture component 430 provide for representing (e.g., converting) the captured image data as digital data (e.g., via an analog-to-digital converter included as part of the infrared sensor or separate from the infrared sensor as part of system 400). In one aspect, the infrared image data (e.g., infrared video data) may comprise non-uniform data (e.g., real image data) of an image, such as scene 470. Processing component 410 may be adapted to process the infrared image data (e.g., to provide processed image data), store the infrared image data in memory component 420, and/or retrieve stored infrared image data from memory component 420. For example, processing component 410 may be adapted to process infrared image data stored in memory component 420 to provide processed image data and information (e.g., captured and/or processed infrared image data).

Control component 440 comprises, in one embodiment, a user input and/or interface device. For example, the user input and/or interface device may represent a rotatable knob (e.g., potentiometer), push buttons, slide bar, keyboard, etc., that is adapted to generate a user input control signal. Processing component 410 may be adapted to sense control input signals from a user via control component 440 and respond to any sensed control input signals received therefrom. Processing component 410 may be adapted to interpret such a control input signal as a parameter value, as generally understood by one skilled in the art.

In one embodiment, control component 440 may comprise a control unit (e.g., a wired or wireless handheld control unit) having push buttons adapted to interface with a user and receive user input control values. In one implementation, the push buttons of the control unit may be used to control various functions of the system 400, such as autofocus, menu enable and selection, field of view, brightness, contrast, noise filtering, high pass filtering, low pass filtering, and/or various other features as understood by one skilled in the art.

Display component 450 comprises, in one embodiment, an image display device (e.g., a liquid crystal display (LCD) or various other types of generally known video displays or monitors). Processing component 410 may be adapted to display image data and information on the display component 450. Processing component 410 may be adapted to retrieve image data and information from memory component 420 and display any retrieved image data and information on display component 450. Display component 450 may comprise display electronics, which may be utilized by processing component 410 to display image data and information (e.g., infrared images). Display component 450 may be adapted to receive image data and information directly from image capture component 430 via the processing component 410, or the image data and information may be transferred from memory component 420 via processing component 410.

Sensing component 460 comprises, in one embodiment, one or more sensors of various types, depending on the application or implementation requirements, as would be understood by one skilled in the art. The sensors of optional sensing component 460 provide data and/or information to at least processing component 410. In one aspect, processing component 410 may be adapted to communicate with sensing component 460 (e.g., by receiving sensor information from sensing component 460) and with image capture component 430 (e.g., by receiving data and information from image capture component 430 and providing and/or receiving command, control, and/or other information to and/or from one or more other components of system 400).

In various implementations, sensing component 460 may provide information regarding environmental conditions, such as outside temperature, lighting conditions (e.g., day, night, dusk, and/or dawn), humidity level, specific weather conditions (e.g., sun, rain, and/or snow), distance (e.g., laser rangefinder), and/or whether a tunnel or other type of enclosure has been entered or exited. Sensing component 460 may represent conventional sensors as generally known by one skilled in the art for monitoring various conditions (e.g., environmental conditions) that may have an effect (e.g., on the image appearance) on the data provided by image capture component 430.

In some implementations, optional sensing component 460 (e.g., one or more of sensors) may comprise devices that relay information to processing component 410 via wired and/or wireless communication. For example, optional sensing component 460 may be adapted to receive information from a satellite, through a local broadcast (e.g., radio frequency (RF)) transmission, through a mobile or cellular network and/or through information beacons in an infrastructure (e.g., a transportation or highway information beacon infrastructure), or various other wired and/or wireless techniques.

In various embodiments, components of system 400 may be combined and/or implemented or not, as desired or depending on the application or requirements, with system 400 representing various functional blocks of a related system. In one example, processing component 410 may be combined with memory component 420, image capture component 430, display component 450, and/or optional sensing component 460. In another example, processing component 410 may be combined with image capture component 430 with only certain functions of processing component 410 performed by circuitry (e.g., a processor, a microprocessor, a logic device, a microcontroller, etc.) within image capture component 430. Furthermore, various components of system 400 may be remote from each other (e.g., image capture component 430 may comprise a remote sensor with processing component 410, etc. representing a computer that may or may not be in communication with image capture component 430).

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed as new and desired to be protected is:

1. A dual-band focal plane array, comprising:
   a readout circuit (ROIC);
   a plurality of electro-optical (EO) polymer pixels for absorbing visible and/or short wave infrared (SWIR) radiation, each of the EO polymer pixels electrically coupled to the ROIC; and
   a plurality of microbolometers for detecting long wave infrared (LWIR) radiation, each microbolometer electrically coupled to the ROIC via contact legs disposed between adjacent microbolometers and between adjacent EO polymer pixels.

2. The focal plane array of claim 1, wherein each EO polymer pixel is comprised of an organic polymer including one of polythiophene (PT), polyphenylene vinylene (PPV), [6,6]-phenyl-C61-butryric acid methyl ester (PCBM), derivatives thereof, or combinations thereof.

3. The focal plane array of claim 1, wherein each microbolometer includes a single or multilayer structure including a radiation absorbing layer comprised of at least one of silicon nitride, silicon dioxide, or silicon oxynitride, and an electrically active material such as amorphous silicon, amorphous silicon-germanium, or vanadium oxide.

4. The focal plane array of claim 1, wherein each microbolometer includes a single or multilayer structure comprising a radiation absorbing layer and an electrically active material and is disposed above each EO polymer pixel, and each EO polymer pixel is disposed between the ROIC and each microbolometer radiation absorbing layer.

5. The focal plane array of claim 1, further comprising a metal contact layer between each EO polymer pixel and the ROIC.

6. The focal plane array of claim 1, wherein at least one of the contact legs is a shared contact leg disposed between adjacent microbolometers.

7. The focal plane array of claim 1, further comprising an overglass layer disposed over each of the EO polymer pixels for electrically isolating each EO polymer pixel.

8. The focal plane array of claim 1, further comprising an electrical contact layer coupling the plurality of EO polymer pixels to a ground line.

9. The focal plane array of claim 8, further comprising an anti-reflective coating disposed over the electrical contact layer.

10. The focal plane array of claim 9, wherein the anti-reflection coating maximizes light transmission to the EO polymer pixel while rejecting light of wavelengths corresponding to the waveband of interest for the plurality of microbolometers.

11. The focal plane array of claim 1, further comprising a processor coupled to the ROIC for processing image information output therefrom, and a display coupled to the processor for displaying the processed image information.

12. A method of fabricating a focal plane array, the method comprising:
    providing a readout circuit (ROIC);
    electrically coupling a plurality of electro-optical (EO) polymer pixels to the ROIC, the EO polymer pixels for absorbing light of a first wavelength; and
    electrically coupling a plurality of microbolometers to the ROIC, each microbolometer electrically coupled via contact legs disposed between adjacent microbolometers and between adjacent EO polymer pixels, each microbolometer for detecting light of a second wavelength.

13. The method of claim 12, wherein each EO polymer pixel is comprised of an organic polymer including one of polythiophene (PT), polyphenylene vinylene (PPV), [6,6]-phenyl-C61-butryric acid methyl ester (PCBM), derivatives thereof, or combinations thereof.

14. The method of claim 12, wherein the light of the first wavelength comprises visible and/or short wave infrared (SWIR) radiation and the light of the second wavelength comprises long wave infrared (LWIR) radiation.

15. The method of claim 12, further comprising
    electrically isolating each of the EO polymer pixels with an overglass layer disposed over each of the EO polymer pixels; and
    electrically coupling the plurality of EO polymer pixels and the plurality of microbolometers to a ground line.

* * * * *